(12) United States Patent
Decaux et al.

(10) Patent No.: US 10,680,489 B2
(45) Date of Patent: Jun. 9, 2020

(54) COOLING DEVICE FOR AN ELECTRICAL MACHINE

(71) Applicant: NISSAN MOTOR CO., LTD., Yokohama-shi, Kanagawa (JP)

(72) Inventors: Stephane Decaux, Rouen (FR); Guillaume Tavernier, La Barre en Ouche (FR); Francois Paris, Amfreville la Mivoie (FR)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 126 days.

(21) Appl. No.: 16/074,959

(22) PCT Filed: Jan. 24, 2017

(86) PCT No.: PCT/FR2017/050142
§ 371 (c)(1),
(2) Date: Aug. 2, 2018

(87) PCT Pub. No.: WO2017/134364
PCT Pub. Date: Aug. 10, 2017

(65) Prior Publication Data
US 2019/0052146 A1 Feb. 14, 2019

(30) Foreign Application Priority Data
Feb. 3, 2016 (FR) ..................... 16 50860

(51) Int. Cl.
*H02K 5/20* (2006.01)
*F28D 15/02* (2006.01)
*H02K 9/19* (2006.01)
*H05K 7/20* (2006.01)

(52) U.S. Cl.
CPC ........... *H02K 5/20* (2013.01); *F28D 15/0266* (2013.01); *H02K 9/19* (2013.01); *H05K 7/20918* (2013.01); *H05K 7/20927* (2013.01)

(58) Field of Classification Search
CPC ........ H02K 5/20; H02K 9/19; F28D 15/0266; H05K 7/20918; H05K 7/20927
USPC ............................................ 165/168, 104.33
See application file for complete search history.

(56) References Cited

U.S. PATENT DOCUMENTS

| | | | | |
|---|---|---|---|---|
| 5,349,831 | A * | 9/1994 | Daikoku | H01L 23/427 165/80.4 |
| 8,018,720 | B2 * | 9/2011 | Campbell | H05K 7/20318 361/700 |
| 8,593,021 | B2 | 11/2013 | Bradfield | |
| 2012/0080117 | A1 | 4/2012 | Bradfield | |

FOREIGN PATENT DOCUMENTS

| | | |
|---|---|---|
| JP | 57-186628 U | 11/1982 |
| JP | 59-172235 U | 11/1984 |
| JP | 03-237207 A | 10/1991 |

(Continued)

*Primary Examiner* — Joel M Attey
(74) *Attorney, Agent, or Firm* — Foley & Lardner LLP

(57) ABSTRACT

A cooling device for an electrical machine, which is intended to be mounted in a mobile assembly, the device including a dielectric liquid reservoir mounted to a casing in a leak-tight manner, and including a discharge conduit for dielectric liquid extending into the reservoir from a discharge hole of the casing at one end of the reservoir toward an opposite end of the reservoir.

10 Claims, 2 Drawing Sheets

(56) References Cited

FOREIGN PATENT DOCUMENTS

| JP | 2007-074894 A | 3/2007 |
|----|---------------|--------|
| JP | 2015-104290 A | 6/2015 |
| JP | 2015-107709 A | 6/2015 |
| JP | 2015-217746 A | 12/2015 |
| KR | 10-2013-0117777 A | 10/2013 |

* cited by examiner

COOLING DEVICE FOR AN ELECTRICAL MACHINE

The present invention relates to a cooling device for an electrical machine mounted in a mobile assembly.

In particular, in the field of electrical engineering, various methods for cooling an electrical machine are known.

In particular, water cooling techniques are known which generally involve circulating in the machine, in the vicinity of the stator windings, a water circuit that is isolated, so as not to bring the water into contact with the electrical components of the machine. Air cooling is also known which involves forcing fresh air to pass into the machine. Finally, cooling with oil is known, and more generally by any heat-transfer dielectric liquid. Oil cooling has several advantages: oil does not pose an electrical isolation problem and does not require bulky installation like air cooling.

In particular, with reference to FIG. 1 of the prior art, oil cooling consisting in spraying oil directly into the casing 3' of the electrical machine 1', in general at the winding heads of the stator 31', are known. The oil flows by gravity to the bottom of the casing 3', where it passes through holes 8", 8''' opening onto an oil reservoir 4'. A pump, not shown, recovers the oil in this reservoir 4', via a suction nozzle 5', in order to re-inject it after cooling at the winding heads of the stator 31'.

However, when such a machine is mounted in a mobile assembly, for example in a motor vehicle, the longitudinal and lateral accelerations to which the machine is subjected, move the oil in the oil reservoir, such that sometimes the suction nozzle is surrounded by air, referred to then as lift. This can lead to air entering the pump and can cause draining of the pump. As a result, this causes a problem of reliability of the cooling of the motor.

Thus, there is a need for an oil cooling device for an electrical machine that can operate reliably when the machine is mounted in a mobile assembly.

The invention proposes a cooling device for an electrical machine, which cooling device is intended to be mounted in a mobile assembly, the cooling device including:
- a casing for receiving the electrical machine,
- a heat-transfer dielectric liquid reservoir having a bottom and two opposite ends, the reservoir being mounted directly below the casing, while the casing has at least one discharge hole for the dielectric liquid opening into the reservoir;
- means for circulating the heat-transfer dielectric liquid in order to suck the heat-transfer dielectric liquid in the bottom of the reservoir and to spray the heat-transfer dielectric liquid onto the electrical machine, while the heat-transfer dielectric liquid flows through the discharge hole; the discharge hole opening at one end of the reservoir.

The cooling device further includes a discharge conduit for the heat-transfer dielectric liquid extending into the reservoir, from the discharge hole toward the other end of the reservoir.

Thus, when lateral acceleration is applied to the mobile assembly, for example a left or right turn for a motor vehicle, if the heat-transfer dielectric liquid is directed toward the hole side, the discharge conduit prevents the heat-transfer dielectric liquid from going back up back into the casing via the hole.

Advantageously and in a non-limiting manner, the suction nozzle is arranged substantially equidistant from the opposite ends of the reservoir.

In particular, the opening of the suction nozzle can be arranged substantially in the vicinity of the bottom of the reservoir. Thus, the suction of the heat-transfer dielectric liquid in the reservoir is improved when the liquid is in motion in the reservoir.

Advantageously and in a non-limiting manner, the discharge conduit has a first end and a second end spaced apart from one another by a distance greater than the distance between the discharge hole and the suction nozzle.

This more effectively prevents the heat-transfer dielectric liquid from going back up into the conduit during an acceleration accumulating the heat-transfer dielectric liquid toward the discharge hole and thus allows the reservoir to always contain enough heat-transfer dielectric liquid to keep the nozzle in the heat-transfer dielectric liquid, even when the heat-transfer dielectric liquid is moved in the reservoir.

In particular, when the effect of sucking the heat-transfer dielectric liquid by the suction nozzle is produced by a pump, it is thus ensured that the suction nozzle is always in the heat-transfer dielectric liquid so as not to risk draining the pump. In this way, the reliability of the operation of the cooling system for the electrical machine is improved, even when the mobile system is subjected to accelerations.

Advantageously and in a non-limiting manner, the first end of the discharge conduit forms a sealed junction with the hole.

Thus, the heat-transfer dielectric liquid flowing through the hole then unavoidably flows into the conduit, thereby preventing uncontrolled flow of the liquid from the hole into the reservoir, and prevents liquid from going back up from the reservoir into the casing during acceleration moving the heat-transfer dielectric liquid in the reservoir.

Advantageously and in a non-limiting manner, the second end of the discharge conduit is arranged in the vicinity of the other end of the reservoir. Thus, the heat-transfer dielectric liquid is more effectively prevented from going back up into the discharge conduit during an acceleration accumulating the heat-transfer dielectric liquid toward the discharge hole.

Advantageously and in a non-limiting manner, the discharge conduit extends diagonally between the first and the second end thereof. This facilitates the flow of the dielectric liquid in the discharge conduit.

In particular, the second end of the conduit can open in the vicinity of the bottom of the reservoir.

Advantageously and in a non-limiting manner, the hole extends substantially over the entire length of the end of the reservoir, i.e. over an entire lateral edge thereof. In this way, the capacities for discharging the heat-transfer dielectric liquid from the casing toward the reservoir are improved.

Advantageously and in a non-limiting manner, the discharge conduit is clipped to the wall of the casing. Thus, a discharge conduit that is relatively simple to fix to the casing can be obtained.

Advantageously and in a nonlimiting manner, the cooling device includes two holes each opening at a separate opposite end of the reservoir, the device includes two conduits each rigidly connected to a separate hole, the conduits each extending from the separate hole toward the end of the reservoir opposite the separate hole. Thus, it is possible to effectively cool the two ends of the stator of the electrical machine, by forming, on the casing downstream of each of the ends of the stator, a hole and by fitting an associated discharge conduit.

Advantageously and in a nonlimiting manner, the heat-transfer dielectric liquid can include oil.

The invention also relates to a motor vehicle including a cooling device as described above.

Other features and advantages of the invention will emerge upon reading the following description of a specific embodiment of the invention, which embodiment is given in an indicative but nonlimiting manner, with reference to the appended drawings wherein.

In the present description, the terms front, rear, upper, lower refer to the front and rear directions of the vehicle, when the cooling device 2 and the electrical machine 1 are mounted on the vehicle. The axes X, Y, Z correspond to the longitudinal (from front to rear), transverse and vertical axis, respectively, of the vehicle.

Substantially horizontal, longitudinal or vertical means a direction/a plane forming an angle of at most ±20°, or of at most 10° or of at most 5° with a direction/a plane that is horizontal, longitudinal or vertical.

Substantially parallel, perpendicular or at a right angle means a direction/an angle diverging by at most ±20°, or by at most 10° or by at most 5° from a parallel or perpendicular direction or from a right angle.

Figure 1:
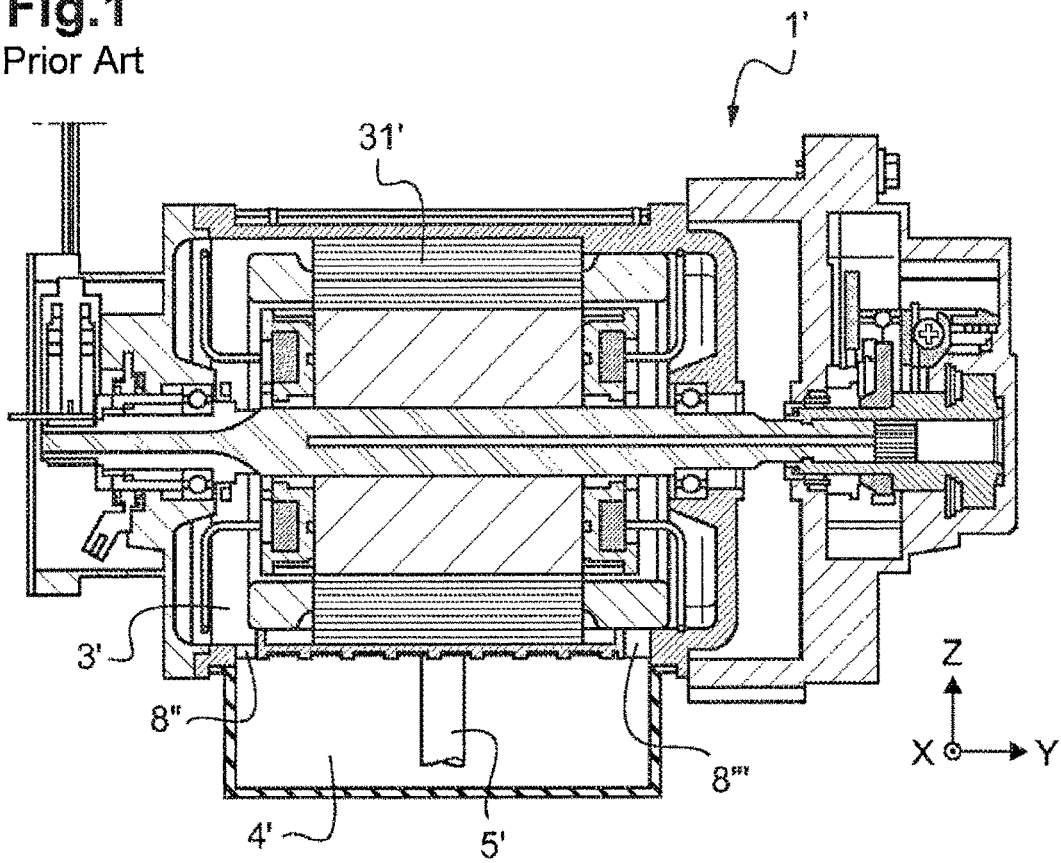
FIG. 1 is a representation of a cooling device for an electrical machine of the prior art.
Figure 2:
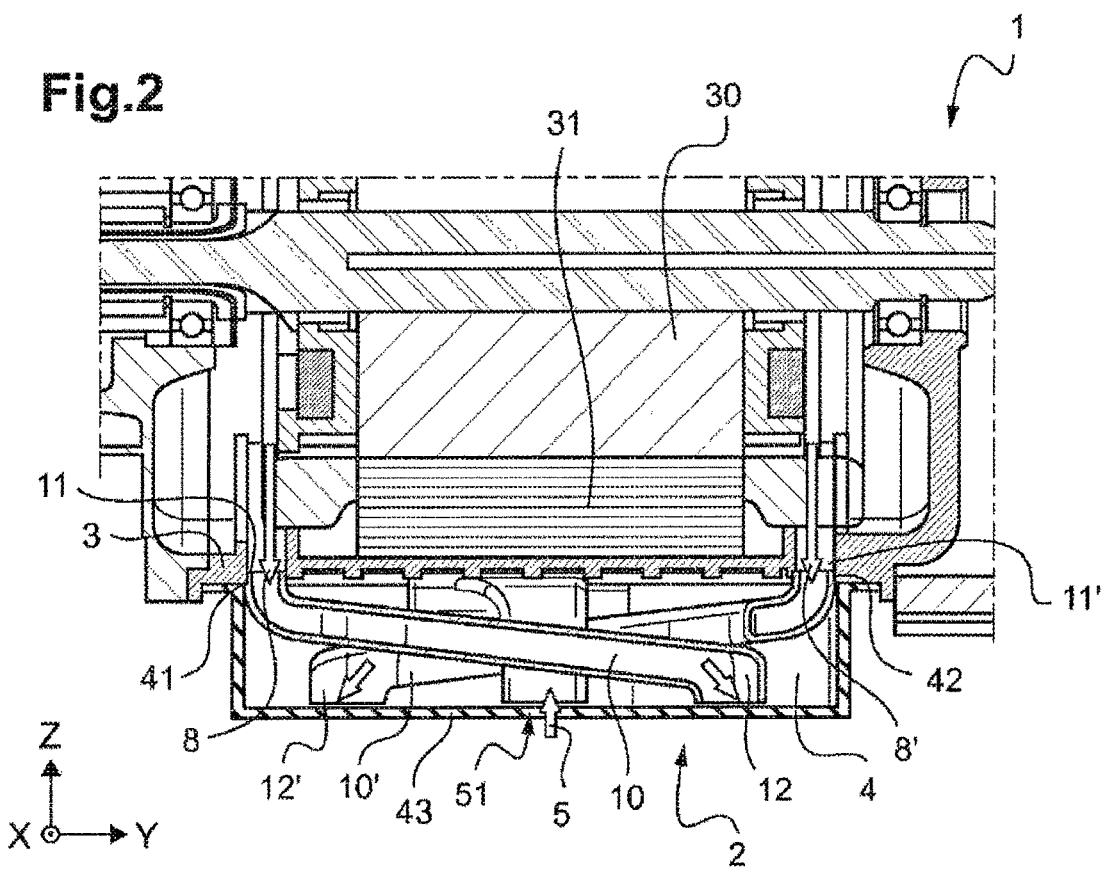
FIG. 2 is a sectional view of a cooling device according to a preferred embodiment of the invention.
Figure 3:
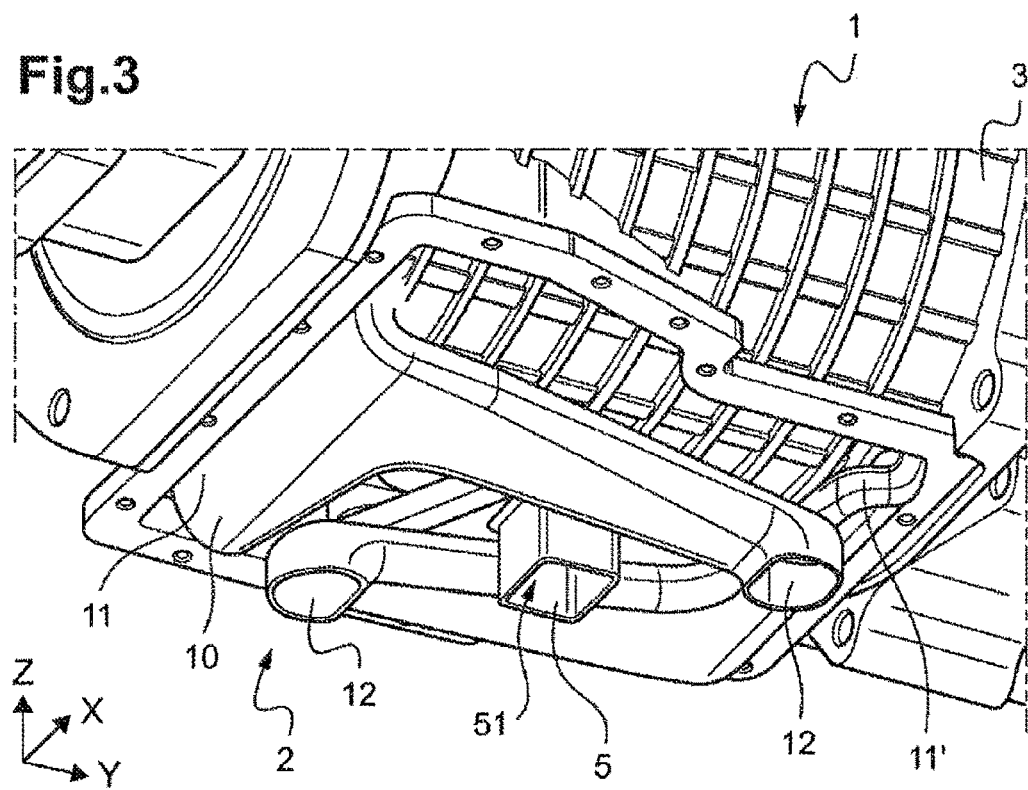
FIG. 3 is a perspective view of a cooling device according to the embodiment of FIG. 2, with the reservoir absent for better visibility.
Figure 4:
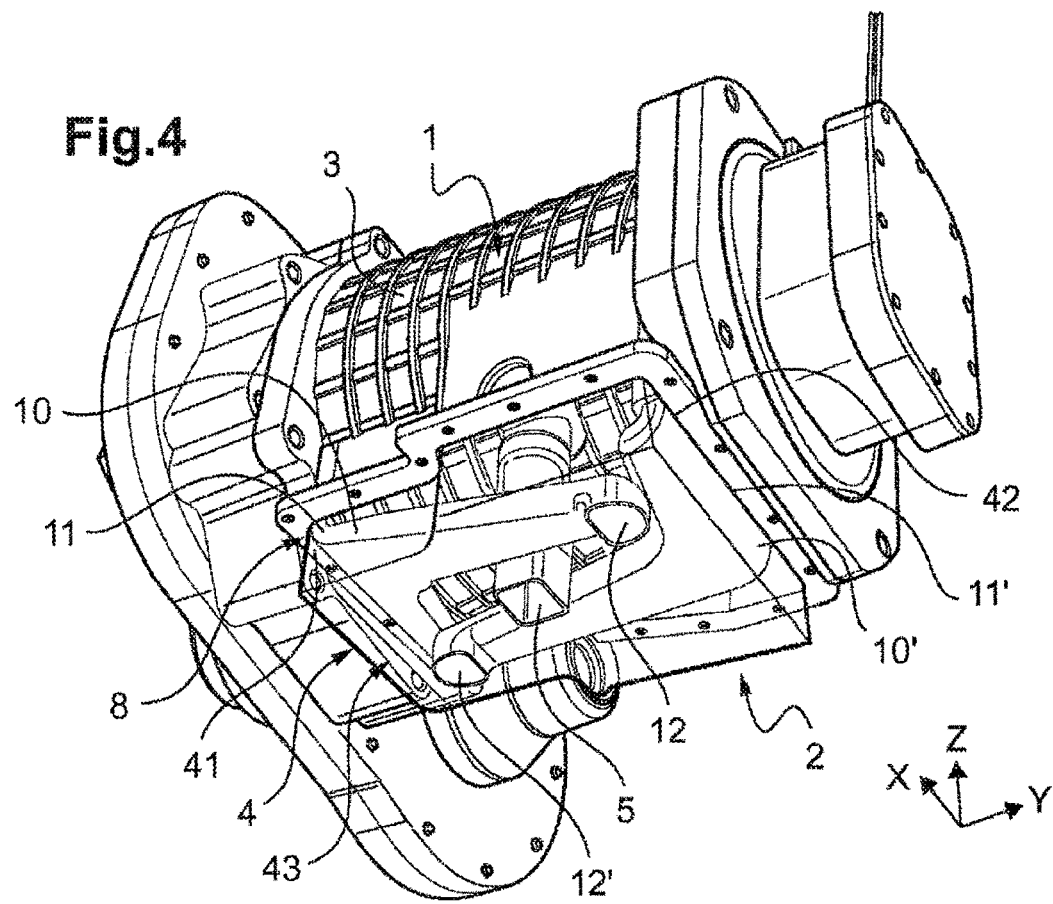
FIG. 4 is a perspective view of a cooling device according to the embodiment of FIG. 2 and of the electrical machine, wherein the reservoir is partially shown.

Since FIGS. 2-4 relate to a same embodiment of the invention, they will be commented upon simultaneously.

An electrical machine 1 is fitted in a mobile assembly, in this case a motor vehicle.

The electrical machine 1 includes a stator 31 and a rotor 30 and is fitted in a casing 3 isolating it from the other components of the motor vehicle.

The casing 3 forms a liquid-tight envelope around the electrical machine 1.

The rotor 30 is inserted into the stator 31 and is rotated about a rotation axis by an electromagnetic field produced by the stator 31.

The electrical machine 1 is oriented in the motor vehicle such that the rotation axis of the rotor 30 is colinear with the transverse direction of the motor vehicle. However, the invention can be adjusted for any other orientation of the electrical machine 1 in the motor vehicle.

Thus, the electrical machine 1 is oriented such that the length thereof extends along the transverse axis of the motor vehicle.

When the motor vehicle is in a stationary position, on a horizontal surface, the rotation axis of the rotor 30 extends, furthermore, in a substantially horizontal plane.

A cooling device 2 for cooling the electrical machine 1 is also fitted in the motor vehicle.

The cooling device 2 operates by heat exchange with a heat-transfer dielectric liquid, in this case oil.

In the rest of the description, reference will be made to the heat-transfer dielectric liquid as being oil. However, any other heat-transfer dielectric liquid can be used.

The cooling device 2 includes an oil reservoir 4 and means for circulating the oil.

The reservoir 4 is rigidly connected in a sealed manner to the casing 3, downstream of the casing 3.

Thus, the reservoir 4 is fitted under the electrical machine 1 and the casing 3 forms the cover of the reservoir 4.

The reservoir 4 is shaped substantially as a rectangular parallelepiped, the main length of which is substantially colinear with the rotation axis of the rotor 30 of the electric machine 1.

Thus, the reservoir 4 extends, substantially in length, parallel to the length of the electrical machine 1, in this case in the transverse direction of the motor vehicle.

In particular, the reservoir 4 has a length substantially greater than the length of the stator 31.

In this case, the length of the reservoir 4 is, at most, equal to the length of the casing 3. Indeed, the reservoir 4 can have a length greater than the length of the casing 3, but this would cause an increase in the general spatial requirement of the assembly formed by the electrical machine 1 and the cooling device 2 which is not desirable.

The width of the reservoir 4 extends along the longitudinal axis of the motor vehicle.

The reservoir 4 has a width substantially equal to the value of the diameter of the stator 31 of the electrical machine 1.

The reservoir 4 has a depth value less than the length and width values.

Indeed, the reservoir 4 is fitted below the casing 3, yet it is frequent in the case of electric machines 1 for driving a motor vehicle, for this machine 1 to be fitted in the rear part of the motor vehicle, under the floor. As a result, in order to comply with the ground clearance requirements of the motor vehicle, the depth of the reservoir 4 is relatively small compared to the length and width dimensions thereof.

The oil circulation means include a suction nozzle 5 suitable for sucking the oil of the reservoir 4 under the effect of the pump, not shown, which conveys the oil up to a spraying element suitable for spraying the oil into the casing 3.

In this case, the spraying element includes, for each longitudinal end of the stator 31, a spraying nozzle fitted in the casing 3 opposite the stator winding head.

The winding head of a stator is all of the parts of the windings visible at each longitudinal end of the stator; visible parts that are also called the winding overhangs. Yet, a significant proportion of the heating of the stator 31 during the operation of the electrical machine 1 is produced at the winding heads. It is for this reason that oil is sprayed directly onto these winding heads.

The oil pumped by the suction nozzle 5 in the reservoir 4 is conveyed, under the effect of the pump, up to the spraying nozzles which spray the oil onto the stator winding heads.

Upon contact with the stator winding heads, the oil heats up by heat exchange, which results in cooling the stator winding heads.

The sprayed oil then flows via gravity as far as the bottom of the casing 3.

The majority of the oil sprayed onto the stator winding heads does not enter the electrical machine, but flows via gravity along the longitudinal end walls of the stator. In other words, the oil neither enters the air gap, nor the stator slots. Thus, the oil flows via gravity on each side of the stator.

A discharge hole 8, 8' is provided, for each longitudinal end of the stator 31, in the bottom wall of the casing 3, substantially downstream of the associated longitudinal end. The hole opens firstly into the reservoir 4 and secondly into the casing 3.

The oil sprayed into the casing 3 at the stator winding head of one end of the stator flows into the bottom of the casing 3, passes through the discharge holes 8, 8' and accumulates in the reservoir 4.

Due to the fact that the length of the reservoir 4 is substantially equal to the length of the casing 3, the discharge holes 8, 8' each extend in the vicinity of a lateral edge 41, 42, respectively, of the reservoir 4.

Reference will also be made to the lateral edges 41, 42 of the reservoir 4 as opposite ends 41, 42 of the reservoir 4.

Thus, a first lateral edge 41, 42 corresponds to an end 41, 42 of the reservoir 4, which end is opposite another end 42, 41 of the reservoir 4, corresponding to the second lateral edge 42, 41.

To properly discharge the oil from the casing 3 toward the reservoir 4, the holes 8, 8' substantially extend over a length of the casing 3 substantially corresponding to the width of the reservoir 4.

Thus, the discharge hole 8, 8' opens into the reservoir 4, in the vicinity of a lateral edge 41, 42, substantially over the entire length of this edge 41, 42.

However, the holes 8, 8' can extend over all or part of the width of the reservoir.

The suction nozzle 5 is fitted in the reservoir 4 such as to be able to suck the accumulated oil. In particular, the suction nozzle 5 is arranged substantially in the middle of the reservoir 4.

The opening 51 of the nozzle 5 is oriented toward the bottom 43 of the reservoir 4, such as to help the immersion thereof in the oil.

The opening 51 of the suction nozzle 5 is brought closer to the bottom 43 of the reservoir 4 such as to maximize the immersion of the nozzle 5 in the oil while ensuring that the oil flows properly between the bottom 43 of the reservoir 4 and the suction nozzle 5. Indeed, under the effect of the pump, the suction nozzle 5 sucks the oil from the reservoir 4, and if the opening 51 of the suction nozzle 5 is out of the oil, the pump risks being drained.

In order to prevent the possibility of the opening 51 of the suction nozzle 5 being located out of the oil, the aim is to ensure that a minimum quantity of oil is always present in the reservoir 4.

Yet, during the transverse accelerations of the motor vehicle, and given the arrangement of the discharge holes 8, 8' of the casing 3, the centrifugal effect causes an accumulation of oil on the reservoir 4 side opposite the turning direction of the motor vehicle. This accumulation of oil causes the oil to go back up through a discharge hole 8, 8'. As the oil goes back up into the casing 3, the quantity of oil present in the reservoir 4 reduces and the opening 51 of the suction nozzle 5 can be located out of the oil.

In order to solve this problem, a discharge conduit 10, 10' is fitted for each discharge hole 8, 8'.

Each discharge conduit 10, 10' extends into the reservoir 4, between a first end 11, 11' and a second end 12, 12'.

The first end 11, 11' of the discharge conduit 10, 10' forms a sealed junction with an associated hole 8, 8'.

The discharge conduits 10, 10' are clipped either to a lateral edge 41, 42 of the reservoir 4, or to a longitudinal edge of the reservoir 4, or to the casing 3 or to several of these attachment points.

The discharge conduits 10, 10' can also be rigidly connected by sticking, welding, screwing or any other suitable means of fixing.

In the rest of the description, the two conduits 10, 10' are described without distinction with respect to one another, the two conduits 10, 10' being substantially identical in the specific structure thereof, which facilitates and reduces the large-scale production costs of such conduits 10, 10'.

For conciseness of the description, when reference is made to the conduit 10, 10', without further specification, it should be understood that this applies to each discharge conduit 10, 10' associated with a hole 8, 8'.

The second end 12, 12' of the conduit 10, 10' opens into the reservoir such as to allow the oil flowing through the hole 8, 8' to flow into the discharge conduit 10, 10' from the first end 11, 11' as far as the second end 12, 12', and to accumulate in the reservoir 4.

The discharge conduit 10, 10' therefore extends from a lateral edge 41, 42, corresponding to the lateral edge 41, 42 in the vicinity of which the associated hole 8, 8' opens, and the discharge conduit 10, 10' extends into the reservoir 4 in the direction of the opposite lateral edge 41, 42, for example in the vicinity of the opposite lateral edge 41, 42.

Thus, the two discharge conduits 10, 10' each associated with a hole 8, 8' pass each other in the reservoir 4. In this manner, the first end 11 of a first discharge conduit 10 is arranged, in the length of the reservoir 4, in proximity to the second end 12' of the other discharge conduit 10', and vice versa.

Thus, the discharge conduit 10, 10' is shaped such that the distance between the first end 11, 11' and the second end 12, 12' in the reservoir 4 is greater than the distance between the associated hole 8, 8' and the opening 51 of the suction nozzle 5.

The discharge conduit 10, 10' extends substantially diagonally into the reservoir 4. Indeed, the first end 11, 11' of the conduit 10, 10', forming a sealed junction with the associated hole 8, 8', is arranged in the top part of the reservoir 4.

In order to allow the oil to flow by gravity in the discharge conduit 10, 10' as far as the second end 12, 12', the conduit has a diagonal profile with a second end 12, 12' that is lower in the reservoir 4 than the first end 11, 11'.

In this case, the second end 12, 12' is arranged in the vicinity of the bottom 43 of the reservoir 4, for example at a same height as the opening 51 of the suction nozzle 5.

The ends 11, 11', 12, 12' of the conduits 10, 10' can have a curved shape, such that they define a substantially vertical portion, which can help the flow of the oil entering and exiting the conduit 10, 10', and in particular for the second end 12, 12', limit the phenomenon of back-flow during transverse accelerations of the motor vehicle.

The conduits 10, 10' thus make it possible to prevent the oil from going back up into the casing 3 via the holes 8, 8' during transverse accelerations of the motor vehicle. In this manner, it is ensured that a minimum quantity of oil is present in the reservoir 4 during these accelerations, in order to keep the opening 51 of the suction nozzle 5 in the oil such as to prevent the pump from being drained.

The invention claimed is:

1. A cooling device for an electrical machine to be mounted in a mobile assembly, the cooling device comprising:
    a casing for receiving the electrical machine;
    a reservoir for a heat-transfer dielectric liquid having a bottom and two opposite ends, the reservoir being mounted directly below the casing, while the casing has at least one discharge hole for the heat-transfer dielectric liquid opening into the reservoir;
    a circulator configured to circulate the heat-transfer dielectric liquid the circulator being configured to suck the heat-transfer dielectric liquid in the bottom of the reservoir for spraying the heat-transfer dielectric liquid onto the electrical machine, while the heat-transfer dielectric liquid flows through the at least one discharge hole opening at one end of the two opposite ends of the reservoir; and a discharge conduit for the dielectric liquid extending into the reservoir from the at least one discharge hole toward the other end of the two opposite ends of the reservoir.

2. The cooling device as claimed in claim 1, wherein the circulator comprises a suction nozzle arranged substantially equidistant from the two opposite ends of the reservoir.

3. The cooling device as claimed in claim 2, wherein the discharge conduit has a first end and a second end spaced apart from one another by a distance greater than a distance between the at least one discharge hole and the suction nozzle.

4. The cooling device as claimed in claim 3, wherein the first end of the discharge conduit forms a sealed junction with the at least one hole.

5. The cooling device as claimed in claim 3, wherein the second end of the discharge conduit is arranged in a vicinity of the other end of the two opposite ends of the reservoir.

6. The cooling device as claimed in claim 3, wherein the discharge conduit extends diagonally between the first end and the second end of the discharge conduit.

7. The cooling device as claimed in claim 1, wherein the at least one discharge hole extends substantially over an entire length of the one end of the reservoir.

8. The cooling device as claimed in claim 1, wherein the discharge conduit is clipped to a wall of the casing.

9. The cooling device as claimed in claim 1, wherein
the at least one discharge hole comprises two separate holes each opening at a separate opposite ends of the reservoir respectively, and
the discharge conduit comprises two conduits rigidly connected to the two separate holes respectively, one of the two conduits extending from one of the two separate holes toward one of the two opposite ends of the reservoir opposite the one of the two separate holes, the other of the two conduits extending from the other of the two separate holes toward the other of the two opposite ends of the reservoir opposite the other of the two separate holes.

10. A motor vehicle comprising a cooling device as claimed in claim 1.

* * * * *